(12) United States Patent
Lin et al.

(10) Patent No.: US 6,822,283 B2
(45) Date of Patent: Nov. 23, 2004

(54) LOW TEMPERATURE MIM CAPACITOR FOR MIXED-SIGNAL/RF APPLICATIONS

(75) Inventors: Dahcheng Lin, Kaohsiung (TW); Min-Hwa Chi, Hsinchu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 69 days.

(21) Appl. No.: 10/194,078

(22) Filed: Jul. 11, 2002

(65) Prior Publication Data

US 2004/0009646 A1 Jan. 15, 2004

(51) Int. Cl.⁷ .............................................. H01L 29/76
(52) U.S. Cl. ...................... 257/309; 257/296; 257/303; 257/306; 257/310
(58) Field of Search ................. 257/296, 303, 257/306, 309, 310

(56) References Cited

U.S. PATENT DOCUMENTS 6,033,967 A * 3/2000 Li et al. ..................... 438/398
6,197,634 B1 * 3/2001 Schuegraf .................. 438/255
6,281,543 B1 * 8/2001 Al-Shareef et al. ......... 257/309
6,323,127 B1 * 11/2001 Andricacos et al. ........ 438/650
6,613,642 B2 * 9/2003 Rahn et al. ................. 438/398

* cited by examiner

*Primary Examiner*—Van Thu Nguyen
*Assistant Examiner*—Doug Menz
(74) *Attorney, Agent, or Firm*—Tung & Associates (57) ABSTRACT

A method for fabricating an MIM capacitor on a substrate. A region of the substrate is dedicated for use as an electrode area of the MIM capacitor. The electrode area of the MIM capacitor may be increased by utilizing at least one spacer formed on an associated planar metal surface, wherein the planar metal surface is formed upon the substrate. An increase in a gain factor of the electrode area is thus dependent upon an associated spacer height and particular number of islands or vias. A roughened surface is thus created for use as a roughened electrode for subsequent capacitor processes. Fabricating spacers made of conducting or non-conducting materials on the associated planar metal surface can create such an electrode. The MIM capacitor formed thereof can be utilized in mixed-signal and RF applications and is fully compatible with COMS logic fabrication processes.

27 Claims, 7 Drawing Sheets

LOW TEMPERATURE MIM CAPACITOR FOR MIXED-SIGNAL/RF APPLICATIONS

TECHNICAL FIELD

The present invention relates to a semiconductor devices and fabrication methods thereof. More specifically, the present invention relates to a semiconductor device having a capacitor and a contact plug in a DRAM (Dynamic Random Access Memory) or the like, and to a manufacturing method thereof. The present invention also relates to MIM capacitor fabrication methods and systems. The present invention also relates to logic-based embedded DRAM devices and manufacturing methods thereof.

BACKGROUND OF THE INVENTION

In the integrated circuit (IC) industry, manufacturers are currently embedding dynamic random access memory (DRAM) arrays on the same substrate as CPU cores or other logic devices. This technology is being referred to as embedded DRAM (eDRAM). Embedded DRAM generally can provide micro-controller (MCU) and other embedded controllers faster access to larger capacities of on-chip memory at a lower cost than that currently available using conventional embedded static random access memory (SRAM) and/or electrically erasable programmable read only memory (EEPROM).

A semiconductor memory cell, such as a cell for DRAM or embedded DRAM, is mainly composed of transistors and capacitors. Therefore, improvement in the efficiency of such structures tends to lead the direction in which the technology is developing. DRAM is a volatile memory, and the manner in which to store digital signals is generally determined by the charge or discharge of the capacitor in the DRAM. When the power applied to the DRAM is turned off, the data stored in the memory cell completely disappears.

A typical DRAM cell usually includes at least one field effect transistor (FET) and at least one capacitor. The capacitor is used to store the charge (i.e., signals) in the cell of DRAM. If more charges can be stored in the capacitor, the capacitor has less interference when the amplifier senses the data. In recent years, DRAM memory cells have been aggressively miniaturized from generation to generation. Even if the memory cell is minimized, a constant capacitance in the range of 20 fF to 30 fF is needed in the storage capacitor of the cell to store the information.

When the semiconductor enters the deep sub-micron process, the size of the device becomes smaller. For the conventional DRAM structure, this means that the space used by the capacitor becomes smaller. Since computer software is gradually becoming huge, even more memory capacity is required. In the case where it is necessary to have a smaller size of each memory cell with an increased capacity of memory, the conventional method of fabricating the DRAM capacitor must change in order to fulfill the requirements of the trend.

There are two approaches at present for reducing the size of the capacitor (i.e., reducing its footprint, while increasing its memory capacity). One approach involves the selection of a high-dielectric material. The other approach involves increasing the surface area of the capacitor electrodes by utilizing 3-dimensional or vertical structures.

There are two main types of vertical capacitor structures for DRAM. The first type of vertical structure is the deep trench-type, which can be formed by digging out a trench and forming capacitors for electrodes and dielectrics inside the trench. The second type of vertical structure is the stacked-type, which can be formed by depositing a capacitive dielectric layer and a conductive layer in sequence for the capacitor.

When a dielectric material with a relatively high dielectric constant is used in a stacked or trench capacitor, the materials for manufacturing the upper and the bottom electrodes need to be carefully selected in order to enhance the performance of the capacitor (e.g., reducing leakage current, or suppressing interfacial oxide formation, etc.). A structure known as a metal-insulator-metal (MIM) structure possesses a low-interfacial reaction specificity to enhance the performance of the capacitor. Therefore, it has become an important topic of research for the semiconductor capacitor in the future.

The obtainable capacitance of each cell's storage capacitor tends to decrease due to the level of the miniaturization of the storage cell. On the other hand, the necessary capacitance of the capacitor is almost constant when the storing voltage to be applied across the capacitor is fixed. Therefore, it is necessary for the capacitor to compensate the capacitance decrease due to the miniaturization by, for example, increasing the surface area of the capacitor. This surface area increase has been popularly realized by increasing the roughness of the lower electrode (e.g., or, storage electrode) surface of the capacitor.

In addition to the application of capacitors to DRAM cells, a capacitor is generally one of the most useful of passive components that is commonly integrated with active bipolar or CMOS transistors in modern VLSI devices. Integrated capacitors are commonly fabricated between polysilicon (i.e. PIP capacitors), poly to polycide/metal (i.e. MIS capacitors), or metal-to-metal (i.e. MIM) capacitors. All of these types of capacitors may be planar in nature for process compatibility and simplicity and can also be formed as 3-dimensional structures for reducing footprints.

The MIM capacitor provides superior advantages for mixed-signal/RF applications than other PIP or MIS capacitors. An MIM capacitor is typically fabricated in the BEOL (back-end-of-line) and requires low process temperatures (i.e., less than 450 C.). Therefore, a minimum disturbance of transistor parameters is present. Additionally, MIM capacitors offer excellent linearity and symmetry due to the lack of the so-called depletion effect in the polysilicon layer, which is generally evidenced in PIP or MIS capacitors. MIM capacitors thus are fully compatible with logic processes in BEOL and are preferred for modern mixed-signal or RF applications. Typical MIM capacitors have a dielectric of PE-oxide (e.g., 400A) deposited at a temperature of 450EC or less with a capacitance density of approximately 1 fF/um$^2$ in planar structures.

For increasingly complex mixed-signal and RF applications, the planar MIM capacitor area is limited by chip size parameters. Thus, the present inventors recognize that a need exists to fabricate capacitors having a small footprint (i.e., higher capacitance density). One common technique for raising the capacitance density involves reducing the dielectric thickness at the cost of worsening linearity and promoting higher leakage currents resulting from higher operating fields. Another common technique involves the utilization of high-k materials (e.g., $Ta_2O_5$). Implementing such a technique, however, often requires special structures of electrode materials that raise complex process integration issues. Still another common technique of increasing capacitance density involves increasing the effective electrode area by roughening the electrode surface.

Based on the foregoing, the present inventors have concluded that new techniques are needed for increasing capacitance density. The present inventors thus present new techniques and devices thereof for increasing the electrode area of MIM capacitors utilizing spacer formations on planar metal surfaces. Such new fabrication methods are fully compatible with CMOS technology and represent a promising future for system-on-chip (SOC) with signal-mix and RF applications.

BRIEF SUMMARY OF THE INVENTION

The following summary of the invention is provided to facilitate an understanding of some of the innovative features unique to the present invention, and is not intended to be a full description. A full appreciation of the various aspects of the invention can be gained by taking the entire specification, claims, drawings, and abstract as a whole.

It is therefore one aspect of the present invention to provide an improved semiconductor fabrication method and devices thereof.

It is another aspect of the present invention to provide a method for fabricating a MIM capacitor.

It is yet another aspect of the present invention to provide a method and for fabricating an MIM (metal insulator metal) capacitor utilized in an embedded DRAM-based semiconductor device.

It is still a further aspect of the present invention to provide a method for fabricating a low-temperature MIM capacitor for mixed-signal/RF applications.

The above and other aspects of the present invention can thus be achieved as is now described. A method for fabricating an MIM capacitor on a substrate is disclosed herein. A region of the substrate is generally dedicated for use as an electrode area of the MIM capacitor. The electrode area of the MIM capacitor may be increased utilizing at least one spacer formed on an associated planar metal surface, wherein the planar metal surface is generally formed upon the substrate. An increase in a gain factor of the electrode area is thus dependent upon an associated spacer height and particular islands or vias. A roughened surface is thus created for use as a roughened electrode for subsequent capacitor processes. Fabricating spacers made of conducting or non-conducting materials on the associated planar metal surface can create such an electrode. The MIM capacitor formed thereof can be utilized in mixed-signal and RF applications and is fully compatible with COMS logic fabrication processes.

Thus, two novel fabrications methods for forming low-temperatures MIM capacitors with surface roughening are described herein. The first MIM capacitor formation technique disclosed herein, in accordance with a preferred embodiment of the present invention, involves the formation of PE-oxide islands on a metal surface. The PE-oxide islands (i.e., oxide islands) will be removed later and is therefore comprise disposable PE-oxide islands. Spacers of conducting materials (e.g., TiN or TaN) are formed by deposition and etching back techniques about the oxide islands. Such a conducting spacer thus provides a short to the metal surface below. Thereafter, the oxide islands are removed. The metal surface with conducting spacers thus becomes a roughened electrode for subsequent capacitor processes of dielectric deposition and top electrode formation.

The second MIM capacitor formation technique disclosed herein, in accordance with an alternative embodiment of the present invention, involves the formation of vias in the oxide layer on metal. After the vias are filled through spin coating with protection material (e.g., photo-resist, organic ARC, and so forth), then the protection material in-between vias is removed by performing CMP (Chemical Mechanical Polishing) or an etch back operation. Now, the oxide surface is then exposed and the inside of the via is filled with a protecting material. An anisotropic oxide etch can then be performed, which leads to the formation of oxide spacers around the protection material (e.g., photoresist organic ARC) in the vias. Following PR removal and cleaning, the oxide spacers around the prior vias on the metal surface are coated with a thin conduction material (e.g., TiN or TaN) to form a roughened electrode surface. Subsequent capacitor processes may then follow to complete remaining fabrication steps. The area gain factor of the resulting electrode thus depends on the spacer height and dimensions of the formed islands (i.e., for the $1^{st}$ technique) or vias (i.e., for the $2^{nd}$ technique).

BRIEF DESCRIPTION OF THE DRAWINGS

The accompanying figures, in which like reference numerals refer to identical or functionally-similar elements throughout the separate views and which are incorporated in and form part of the specification, further illustrate the present invention and, together with the detailed description of the invention, serve to explain the principles of the present invention.

DETAILED DESCRIPTION OF THE INVENTION

The particular values and configurations discussed in these non-limiting examples can be varied and are cited merely to illustrate embodiments of the present invention and are not intended to limit the scope of the invention.

In order to understand the semiconductor fabrication techniques disclosed herein, in accordance with preferred or alternative embodiments of the present inventions, it is helpful to understand prior art semiconductor fabrication techniques in greater detail. The prior art fabrication technique illustrated in FIGS. 1 to 9 is presented for illustrative and edification purposes only and is not a limiting feature of the present invention. FIGS. 1 to 9 represent one example of process flow for conventional planar MIM capacitors for mixed-signal/RF applications. The MIM capacitor in FIGS. 1 to 9 have an area of 25 m×25 m and approximately 1 fF/um$^2$ in a planar AL/PE-oxide/Al structure.

Figure 1:
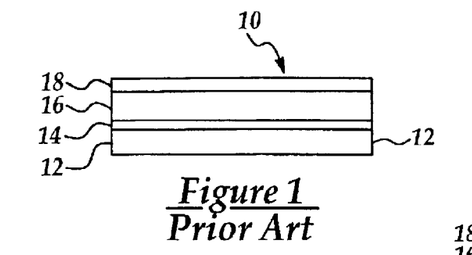
FIG. 1 depicts a first step of a prior art fabrication process in which surface roughing techniques are not utilized.

FIG. 1 thus depicts a first step 10 of a prior art fabrication process in which surface roughing techniques are not utilized. As illustrated in FIG. 1, a layer 14 of TiN (e.g., 250 A) can be deposited above substrate 12. Layer 16, deposited above layer 14, comprises Al—Cu (i.e., aluminum with approximately 1–2% copper, 4 kA). Finally, a layer 18 of TiN (e.g., 250 A) is deposited above layer 16. Layers 14 and 18 are commonly referred to as capping layer for Al—Cu layer 16. Layers 14, 16 and 18 together thus may comprise a complete conducting layer in interconnection. Such a complete interconnect conducting layer may be repeated for multi-layer connection in modern BEOL technology of CMOS, i.e. six layers for a typical 0.13 Fm CMOS technology. As illustrated in FIG. 1, the label "metal-5" denotes the 5$^{th}$ conducting layer, and can serve as the bottom electrode of the MIM capacitor. Note that in FIGS. 1–9 herein, like parts are indicated by identical reference numerals.

Figure 2:
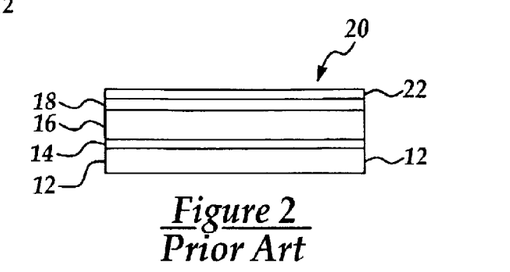
FIG. 2 illustrates a second step of a prior art fabrication process in which surface roughing techniques are not utilized.

FIG. 2 illustrates a second step 20 of a prior art fabrication process in which surface roughing techniques are not utilized. As illustrated in FIG. 2, a layer 22 is deposited above layer 18. Layer 22 generally comprises a PE-oxide (i.e. approximately 400 A) with deposition at a low temperature of approximately 400 EC.

Figure 3:
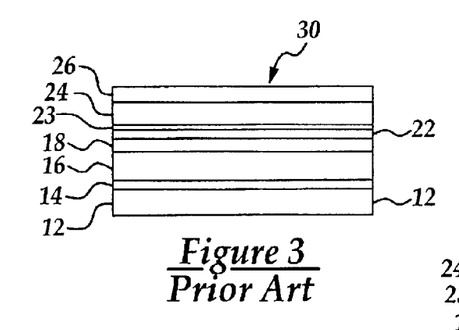
FIG. 3 depicts a third step of a prior art fabrication process in which surface roughing techniques are not utilized.

FIG. 3 depicts a third step 30 of a prior art fabrication process in which surface roughing techniques are not utilized. As indicated in FIG. 3, a layer 23 of TiN (e.g., 250 A) can be deposited above layer 22. A layer 24 can thereafter be deposed above layer 23. Layer 24 can be composed of, for example, Al—Cu (1.2 kA). Finally, a layer 26 of TiN (e.g., 750 A) may be deposited above layer 24 as a capping layer. Layers 23, 24 and 26 in FIG. 3 are referred to as capacitor top metal (CTM) layers, including TiN (250 A), Al—Cu (1200 A) and Tin (750 A).

Figure 4:
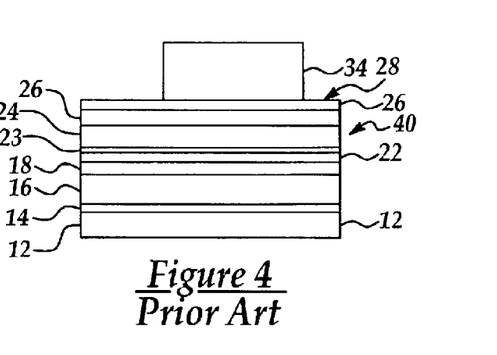
FIG. 4 illustrates a fourth step of a prior art fabrication process in which surface roughing techniques are not utilized.

FIG. 4 illustrates a fourth step 40 of a prior art fabrication process in which surface roughing techniques are not utilized. As depicted in FIG. 4, a photo-resist 34 is formed above layer 28. Layer 28 is an SiON layer having a value of approximately 300 A and serving as an anti-reflective coating (ARC) layer at the bottom of the photoresist layer 34. Thus, layer 28 is referred to as the bottom anti-reflective coating (BARC) in FIG. 4. Photoresist 34 is then patterned for a capacitor top metal (CTM).

Figure 5:
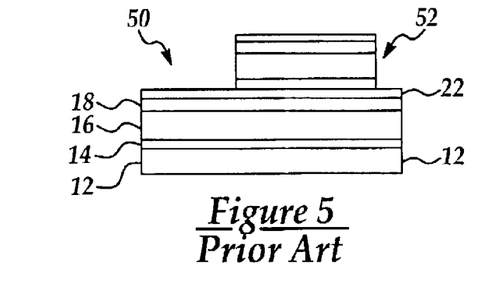
FIG. 5 depicts a fifth step of a prior art fabrication process in which surface roughing techniques are not utilized.
Figure 6:
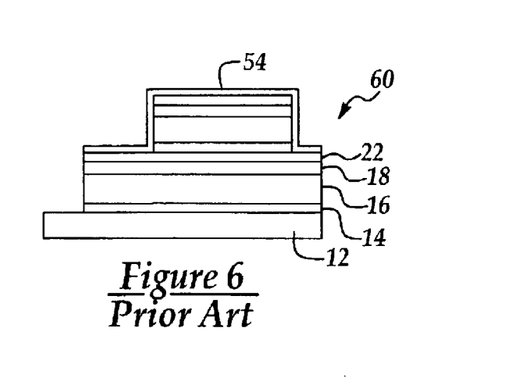
FIG. 6 illustrates a sixth step of a prior art fabrication process in which surface roughing techniques are not utilized.

FIG. 5 depicts a fifth step 50 of a prior art fabrication process in which surface roughing techniques are not utilized. As illustrated in FIG. 5, after etching layer 28, 26, 24 and 23, and removing photo-resist 34 to form a structure 52 of capacitor top metal (CTM) is achieved. The CTM structure 52 surface area is approximately 25 um×25 um. FIG. 6 illustrates a sixth step 60 of a prior art fabrication process in which surface roughing techniques are not utilized. As depicted in FIG. 6, a layer 54 of SiON (e.g., 300 A) is deposited. Note that layer 54 and layer 28 are both SiON in structure 52.

Figure 7:
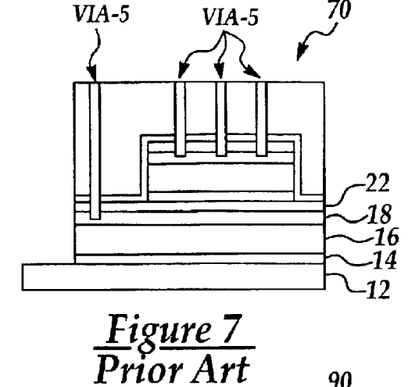
FIG. 7 depicts a seventh step of a prior art fabrication process in which surface roughing techniques are not utilized.
Figure 8:
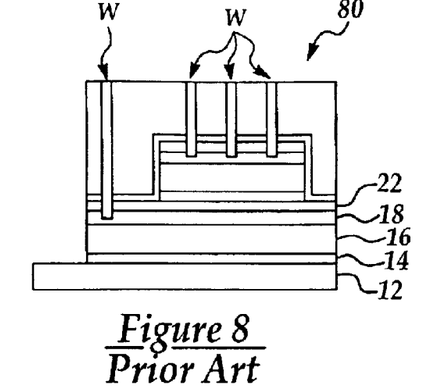
FIG. 8 illustrates an eighth step of a prior art fabrication process in which surface roughing techniques are not utilized.
Figure 9:
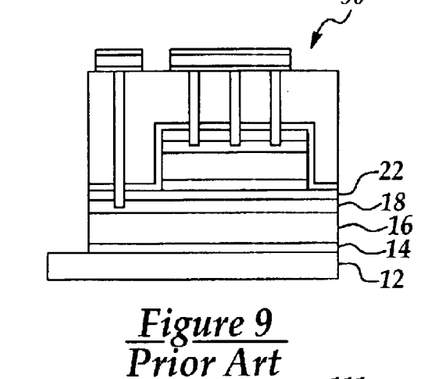
FIG. 9 depicts a ninth step of a prior art fabrication process in which surface roughing techniques are not utilized.

FIG. 7 depicts a seventh step 70 of a prior art fabrication process in which surface roughing techniques are not utilized. FIG. 7 illustrates an FSG deposition operation followed by CMP planarization. Then, Via-5 photo patterning occurs followed by a via-5 etching step. Note that the term FSG refers to fluorinated silicon oxide. Note that Via-5 etching can utilize SiON as an etch stop and then reach the metal-5 and CTM illustrated in FIG. 7. FIG. 8 illustrates an eighth step 80 of a prior art fabrication process in which surface roughing techniques are not utilized. As indicated in FIG. 8, the vias are filled with Tungsten (W) by well-known W-deposition and followed by CMP or etch back methods. FIG. 9 depicts a ninth step 90 of a prior art fabrication process in which surface roughing techniques are not utilized. Finally, as indicated in FIG. 9, metal-6 layers (i.e. Al, with TiN capping layers) may be formed and patterned above the W-plugs in vias, thereby forming an MIM capacitor. Thus, those skilled in the art can appreciate that the MIM structure formed as a result of the fabrication processing operations illustrated in FIGS. 1–9 contains a capacitor that is limited by the CTM area and PE-oxide thickness of layer 22.

Figure 10:
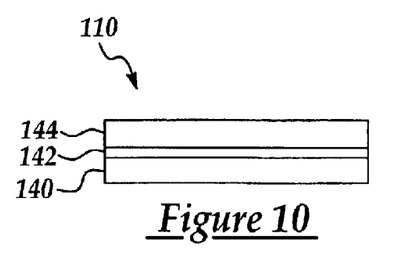
FIG. 10 illustrates a first step of a fabrication process for forming a roughened surface around disposable oxide islands, in accordance with a preferred embodiment of the present invention.

FIGS. 10–21 illustrate one MIM capacitor fabrication that may be implemented in accordance with a preferred embodiment of the present invention. FIGS. 10–21 depicts a method for forming an MIM capacitor having a roughened electrode surface. Note that in FIGS. 10–21 herein, like parts are indicated by identical reference numerals. FIG. 10 illustrates a first step 110 of a MIM capacitor process for forming a roughened surface around disposable oxide islands, in accordance with a preferred embodiment of the present invention. As indicated in FIG. 10, a layer 142 is formed above a substrate 140. Substrate 140 represents the surface after all front-end-of-line (FEOL) and BEOL fabrication operation before layer 142 deposition. Layer 142 may be composed of TiN (250 A). A layer 144 is then formed above layer 142. Layer 144 may be composed of Al—Cu (4 kA).

Figure 11:
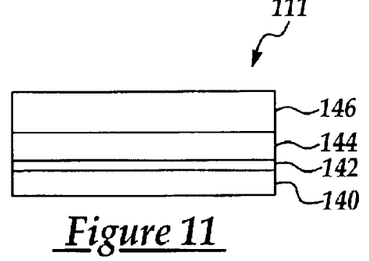
FIG. 11 depicts a second step of a fabrication process for forming a roughened surface around disposable oxide islands, in accordance with a preferred embodiment of the present invention.

FIG. 11 depicts a second step 111 of a MIM capacitor process for forming a roughened surface around disposable oxide islands, in accordance with a preferred embodiment of the present invention. As indicated in FIG. 11, a layer 146 of PE-oxide (1 kA B 15 kA) is deposited above layer 144 at a low temperature of approximately 400 EC.

Figure 12:
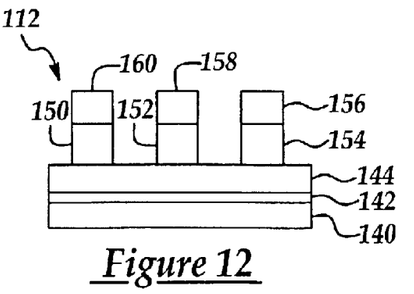
FIG. 12 illustrates a third step of a fabrication process for forming a roughened surface around disposable oxide islands, in accordance with a preferred embodiment of the present invention.

FIG. 12 illustrates a third step 112 of a MIM capacitor process for forming a roughened surface around disposable oxide islands, in accordance with a preferred embodiment of the present invention. As depicted in FIG. 12, after PE-oxide photo patterning and etching operations are processed.

PE-oxide islands 150, 152, 154 thus are formed below photo-resists 160, 158, and 156. Photoresist is then removed.

Figure 13:
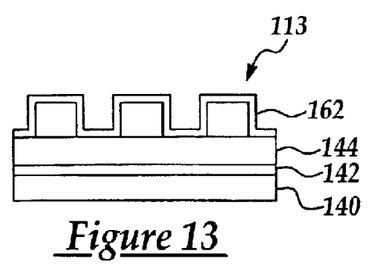
FIG. 13 depicts a fourth step of a fabrication process for forming a roughened surface around disposable oxide islands, in accordance with a preferred embodiment of the present invention.

FIG. 13 depicts a fourth step 113 of a MIM capacitor process for forming a roughened surface around disposable oxide islands, in accordance with a preferred embodiment of the present invention. Following island topography, as illustrated in FIG. 12, a thin TiN layer 162 is deposited, as depicted in FIG. 13. The thin conducting layer 162 of TiN (i.e. approximately 250 A) is in direct contact to layer 144 as well as PE-oxide islands.

Figure 14:
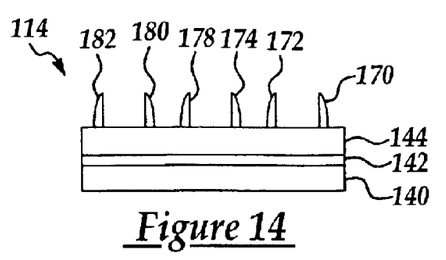
FIG. 14 illustrates a fifth step of a fabrication process for forming a roughened surface around disposable oxide islands, in accordance with a preferred embodiment of the present invention.

FIG. 14 illustrates a fifth step 114 of a MIM capacitor process for forming a roughened surface around disposable oxide islands, in accordance with a preferred embodiment of the present invention. As depicted in FIG. 14, a direct TiN etch back is performed to form TiN spacers 182, 180, 178, 174, 172, and 170 around the oxide islands (i.e. ring shaped). For example, spacers 180 and 182 are actually can form a ring around the oxide island 150. The oxide islands 150, 152, and 154 are removed and the TiN spacers remain standing on the Al—Cu surface (i.e., layer 144). Note that the TiN spacers are configured to form an electrical short to the metal surface (i.e., layer 144) below. As indicated in FIG. 14, TiN spacers 182, 180, 178, 174, 172, and 170 can be formed by anisotropic TiN etch back operations, followed by PE-oxide removal. The oxide islands are therefore referred to as disposable oxide islands.

Figure 15:
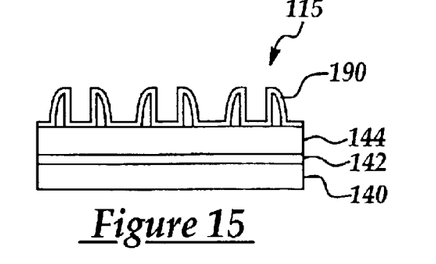
FIG. 15 depicts a sixth step of a fabrication process for forming a roughened surface around disposable oxide islands, in accordance with a preferred embodiment of the present invention.

FIG. 15 depicts a sixth step 115 of a MIM capacitor process for forming a roughened surface around disposable oxide islands, in accordance with a preferred embodiment of the present invention. After the TiN spacer formation, an optional thin TiN glue/barrier layer 190 of approximately 250 A can be deposited to firmly secure and smooth sharp tips of TiN spacers on the metal surface as the bottom electrode. Note that the overall TiN/Al—Cu/Tin spacer is labeled as Ametal-5@ (by assuming prior metal-1 to metal-4 layers as well as intermetal dielectric layers are processed by conventional CMOS fabrication processes and are included in the substrate 140).

Figure 16:
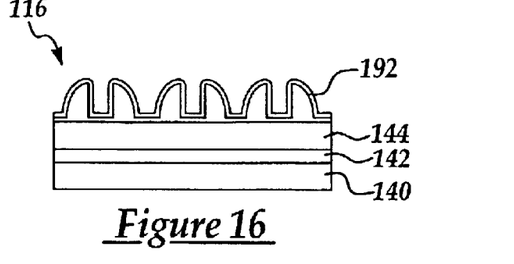
FIG. 16 illustrates a seventh step of a fabrication process for forming a roughened surface around disposable oxide islands, in accordance with a preferred embodiment of the present invention.

FIG. 16 illustrates a seventh step 116 of a MIM capacitor process for forming a roughened surface around disposable oxide islands, in accordance with a preferred embodiment of the present invention. After a metal-5 (i.e., bottom electrode) is formed, a thin dielectric layer 192 (e.g., PE-oxide of approximately 400 A) can be deposited at 400 EC.

Figure 17:
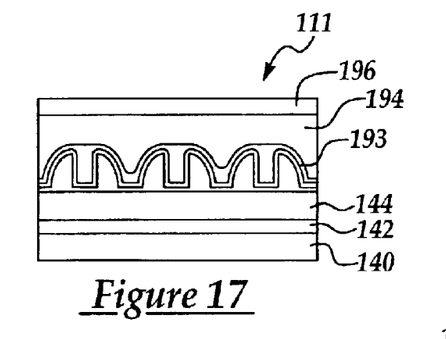
FIG. 17 depicts an eighth step of a fabrication process for forming a roughened surface around disposable oxide islands, in accordance with a preferred embodiment of the present invention.

FIG. 17 depicts an eighth step 111 of a MIM capacitor process for forming a roughened surface around disposable oxide islands, in accordance with a preferred embodiment of the present invention. Following processing of the operation illustrated at block 17, a sequential deposition of TiN (200A) layer 193, Al—Cu (1.2 kA) layer 194, and TiN (700 A) layer 196 can be performed to form an MIM capacitor top electrode (referred to as CTM structure 200 in FIG. 18. It is understood, of course, that the values assigned to the various layers described herein are presented for illustrative purposes only and are not considered limiting features of the present invention.

Figure 18:
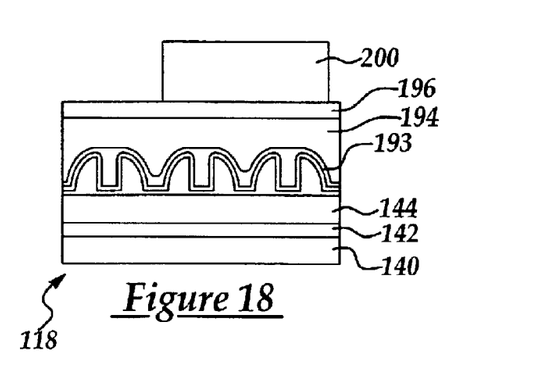
FIG. 18 illustrates a ninth step of a fabrication process for forming a roughened surface around disposable oxide islands, in accordance with a preferred embodiment of the present invention.

FIG. 18 illustrates a ninth step 200 of a MIM capacitor process for forming a roughened surface around disposable oxide islands, in accordance with a preferred embodiment of the present invention. A SiON BARC deposition of approximately 320 A is performed along with a capacitor top metal (CTM) photo patterning operation. As indicated in FIG. 18, photoresist pattern 200 for CTM is formed above layer 196.

Figure 19:
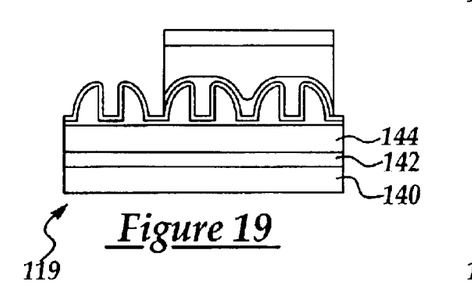
FIG. 19 depicts a tenth step of a fabrication process for forming a roughened surface around disposable oxide islands, in accordance with a preferred embodiment of the present invention.

FIG. 19 depicts a tenth step 119 of a MIM Capacitor process for forming a roughened surface around disposable oxide islands, in accordance with a preferred embodiment of the present invention. As indicated in FIG. 19, a capacitor top metal (CTM) etching operation is performed with a stop on PE oxide (i.e., CTM surface area can be approximately 25 Fm×25 Fm). After removing the photoresist, the CTM is formed.

Figure 20:
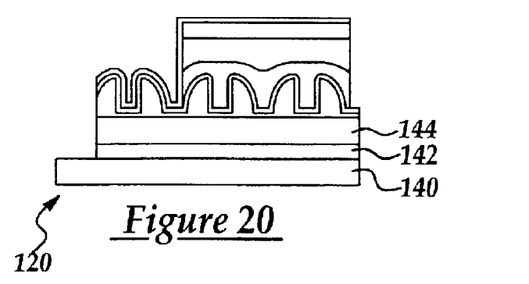
FIG. 20 illustrates an eleventh step of a fabrication process for forming a roughened surface around disposable oxide islands, in accordance with a preferred embodiment of the present invention.

FIG. 20 illustrates an eleventh step 120 of a MIM capacitor process for forming a roughened surface around disposable oxide islands, in accordance with a preferred embodiment of the present invention. Thus, after forming the CTM structure, another SiON layer (300 A) is deposited for sealing the edge of dielectric CTM.

Figure 21:
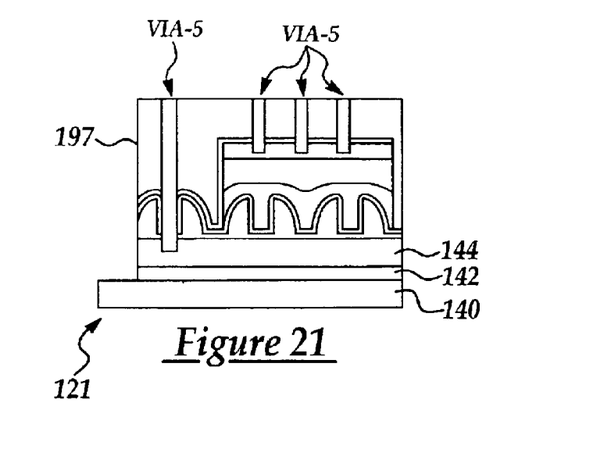
FIG. 21 depicts a twelfth step of a fabrication process for forming a roughened surface around disposable oxide islands, in accordance with a preferred embodiment of the present invention.

FIG. 21 depicts a twelfth step 121 of a MIM capacitor process for forming a roughened surface around disposable oxide islands, in accordance with a preferred embodiment of the present invention. In FIG. 21, an FSG deposition operation of approximately 10 kA-20 kA is performed and followed by CMP planarization for an inter-metal-dielectric (IMD-5) layer. See reference numeral 197 for an indication of the FSG deposition operation. Then Via-5 is formed by photo patterning, oxide etching and photoresist removing.

Figure 22:
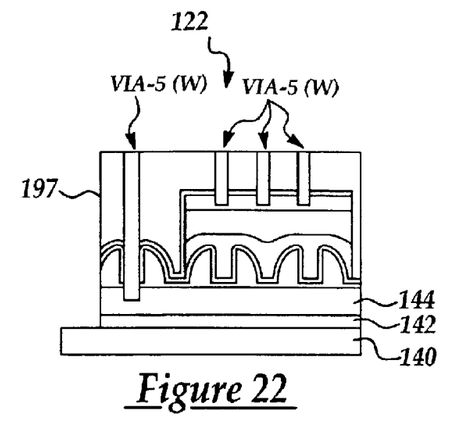
FIG. 22 illustrates a thirteenth step of a fabrication process for forming a roughened surface around disposable oxide islands, in accordance with a preferred embodiment of the present invention.

FIG. 22 illustrates a thirteenth step 121 of a MIM capacitor process for forming a roughened surface around disposable oxide islands, in accordance with a preferred embodiment of the present invention. As indicated in FIG. 22, Ti/TiN/W depositions for Via-5 filling operations are performed, followed by CMP for isolation of vias.

Figure 23:
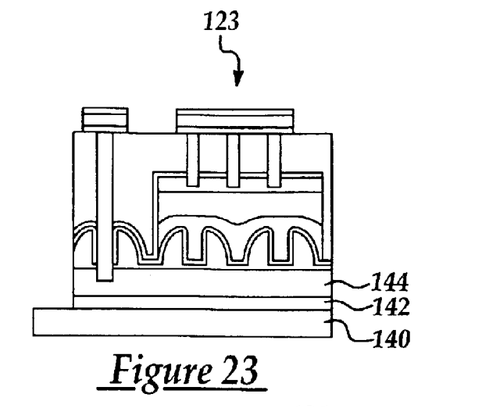
FIG. 23 depicts a fourteenth step of a fabrication process for forming a roughened surface around disposable oxide islands, in accordance with a preferred embodiment of the present invention.

FIG. 23 depicts a thirteenth step 123 of a MIM capacitor process for forming a roughened surface around disposable oxide islands, in accordance with a preferred embodiment of the present invention. As illustrated in FIG. 23, metal-6 (including TiN/Cu—Al/Tin) depositions are performed followed by photo patterning and etching. Remaining fabrication processes can be implemented for mixed-signal/RF devices.

Figure 24:
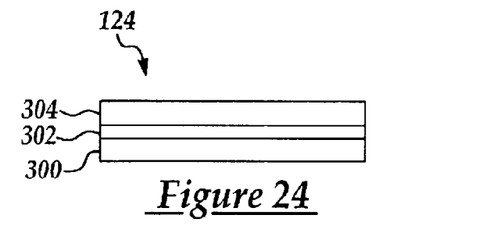
FIG. 24 illustrates a first step of a fabrication process in which a surface is roughened by oxide spacers around vias, in accordance with an alternative embodiment of the present invention.

FIGS. 24–37 illustrate an alternative embodiment of the present invention in which a surface may be roughened by one or more oxide spacers formed around vias. Note that in FIGS. 24 to 37, like parts are indicated by identical reference numerals. FIG. 24 thus illustrates a first step 124 of a MIM capacitor process in which a surface is roughened by oxide spacers around vias, in accordance with an alternative embodiment of the present invention. As indicated in FIG. 24, a substrate 300 is utilized (with all prior FEOL and BEOL fabrication operations completed) upon which subsequent layers for MIM capacitor may be formed. A layer 302 is composed of TiN (250A) can be deposited above substrate 300. A layer 304, is Al—Cu (4 kA), is deposited above layer 302. Thus, FIG. 24 describes an operational step in which metal layers is deposited to form a bottom electrode.

Figure 25:
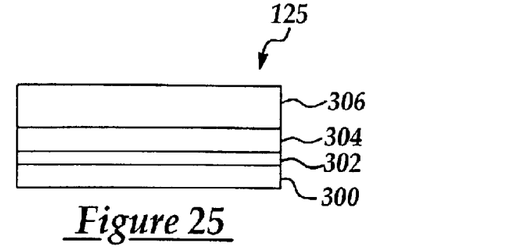
FIG. 25 depicts a second step of a fabrication process in which a surface is roughened by oxide spacers around vias, in accordance with an alternative embodiment of the present invention.

FIG. 25 depicts a second step 125 of a MIM capacitor process in which a surface is roughened by oxide spacers around vias, in accordance with an alternative embodiment of the present invention. As illustrated in FIG. 25, a PE-oxide, layer 306, deposition step is performed at a low temperature of approximately 400 EC. Layer 306 is formed above layer 304.

Figure 26:
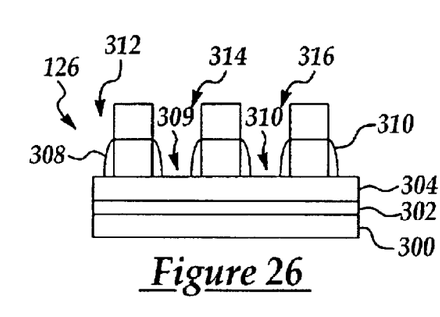
FIG. 26 illustrates a third step of a fabrication process in which a surface is roughened by oxide spacers around vias, in accordance with an alternative embodiment of the present invention.

FIG. 26 illustrates a third step 126 of a MIM capacitor process in which a surface is roughened by oxide spacers around vias, in accordance with an alternative embodiment of the present invention. As indicated in FIG. 26, tapered via holes are formed (instead of oxide islands, which is the case with the configuration of the preferred embodiment of the present invention described herein with respect to FIG. 12). Thus, a PE-oxide photo patterning and etching operations are performed to form one or more tapered vias, followed by photoresist removal. As indicated in FIG. 26, vias in PE-oxide 308, 309, and 310 are formed photoresist openings of 312, 314, and 316.

Figure 27:
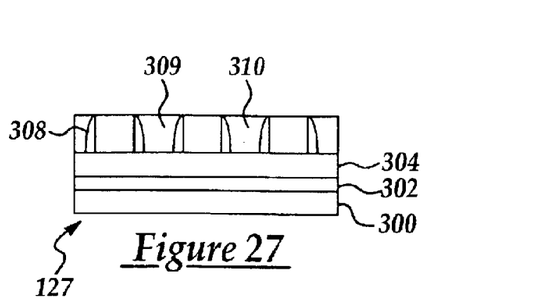
FIG. 27 depicts a fourth step of a fabrication process in which a surface is roughened by oxide spacers around vias, in accordance with an alternative embodiment of the present invention.

FIG. 27 depicts a fourth step 127 of a MIM capacitor process in which a surface is roughened by oxide spacers around vias, in accordance with an alternative embodiment of the present invention. As indicated in FIG. 27, photoresist (PR) spin coating and removal operations are performed by partial photo-exposure and development or etch back or CMP until PE-oxide surface is exposed.

Figure 28:
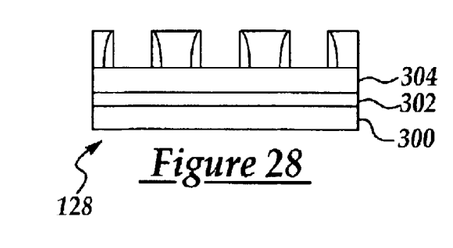
FIG. 28 illustrates a fifth step of a fabrication process in which a surface is roughened by oxide spacers around vias, in accordance with an alternative embodiment of the present invention.

FIG. 28 illustrates a fifth step 128 of a fabrication process in which a surface is roughened by oxide spacers around vias, in accordance with an alternative embodiment of the present invention. With the tapered via holes protected by PR, an anisotropic oxide etching operation is implemented to remove the exposed PE-oxide layers, resulting in oxide spacers (rings) around the vias, as illustrated in FIG. 28.

Figure 29:
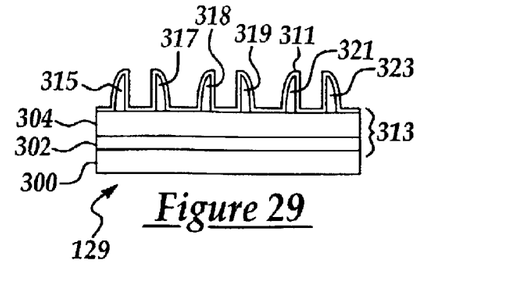
FIG. 29 depicts a sixth step of a fabrication process in which a surface is roughened by oxide spacers around vias, in accordance with an alternative embodiment of the present invention.

FIG. 29 depicts a sixth step 129 of a MIM capacitor process in which a surface is roughened by oxide spacers around vias, in accordance with an alternative embodiment of the present invention. After PR (in vias) removal, a thin TiN layer 311 of approximately 250 A can be deposited on the oxide spacer surface to secure oxide spacer rings smoothly and firmly standing on a metal surface. Note that in FIG. 29, reference numeral 313 generally refers to the bottom electrode (e.g. the metal-5 layer). Reference numerals 315, 317, 318, 318, 319, 321 and 323 generally indicate the presence of an oxide spacer structure with ring shape (i.e. 317 and 318 are formed as a ring around via 309).

Figure 30:
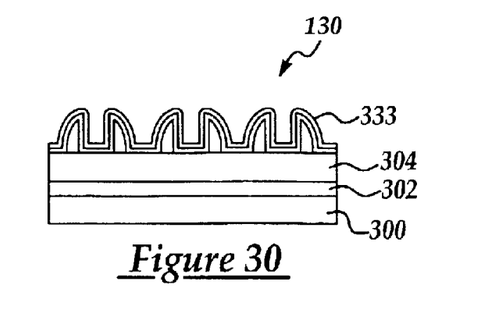
FIG. 30 illustrates a seventh step of a fabrication process in which a surface is roughened by oxide spacers around vias, in accordance with an alternative embodiment of the present invention.

FIG. 30 illustrates a seventh step 130 of a MIM capacitor process in which a surface is roughened by oxide spacers around vias, in accordance with an alternative embodiment of the present invention. As depicted in FIG. 30, capacitor dielectric film of PE-oxide layer 333, with thickness of approximately 400 A is performed at a temperature of about 400 EC.

Figure 31:
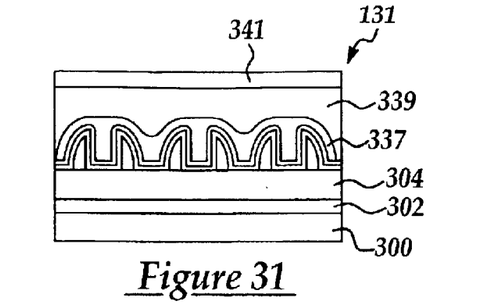
FIG. 31 depicts an eighth step of a fabrication process in which a surface is roughened by oxide spacers around vias, in accordance with an alternative embodiment of the present invention.

FIG. 31 depicts an eighth step 131 of a MIM capacitor process in which a surface is roughened by oxide spacers around vias, in accordance with an alternative embodiment of the present invention. FIG. 31 indicates layers for capacitor top metal (CTM), including a TiN layer 337 of approximately 250 A, an Al—Cu layer 339 of approximately 1200 A, and a TiN layer 341 of approximately 700 A to 750 A.

Figure 32:
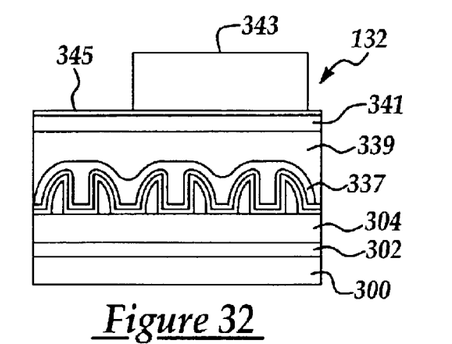
FIG. 32 illustrates a ninth step of a fabrication process in which a surface is roughened by oxide spacers around vias, in accordance with an alternative embodiment of the present invention.

FIG. 32 illustrates a ninth step 132 of a MIM capacitor process in which a surface is roughened by oxide spacers around vias, in accordance with an alternative embodiment of the present invention. As illustrated in FIG. 32, an SiON BARC deposition 345 of approximately 320 A is performed, followed by photoresist pattern 343 capacitor top metal (CTM) is performed.

Figure 33:
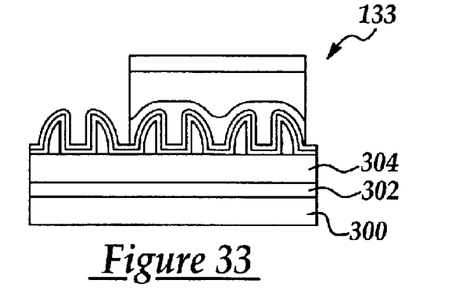
FIG. 33 depicts a tenth step of a fabrication process in which a surface is roughened by oxide spacers around vias, in accordance with an alternative embodiment of the present invention.

FIG. 33 depicts a tenth step 133 of a MIM capacitor process in which a surface is roughened by oxide spacers around vias, in accordance with an alternative embodiment of the present invention. As illustrated in FIG. 33, a capacitor top metal (CTM) layer etching operation is performed by stopping on PE-oxide. The CTM surface area is approximately 25 Fm×25 Fm.

Figure 34:
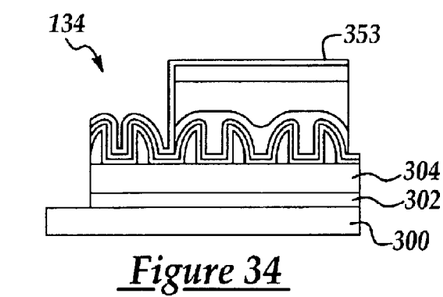
FIG. 34 illustrates an eleventh step of a fabrication process in which a surface is roughened by oxide spacers around vias, in accordance with an alternative embodiment of the present invention.

FIG. 34 illustrates an eleventh step 134 of a MIM capacitor process in which a surface is roughened by oxide spacers around vias, in accordance with an alternative embodiment of the present invention. As indicated in FIG. 34, a SiON BARC deposition 353 operation of approximately 300A is performed for sealing the edge of capacitor dielectric around CTM.

Figure 35:
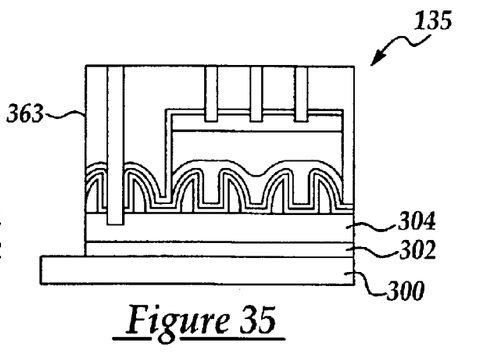
FIG. 35 depicts a twelfth step of a fabrication process in which a surface is roughened by oxide spacers around vias, in accordance with an alternative embodiment of the present invention.

FIG. 35 depicts a twelfth step 135 of a MIM capacitor process in which a surface is roughened by oxide spacers around vias, in accordance with an alternative embodiment of the present invention. As indicated in FIG. 35, an FSG deposition (10 kA-20 kA) 363 operation is performed. Additionally, a CMP planarization operation is performed for planarizing inter-metal-dielectric (IMD-5). Via-5 photo patterning and oxide etching is performed so that vias (via-5) are formed after photoresist removal.

Figure 36:
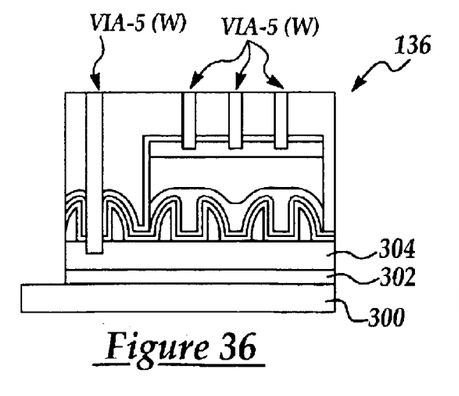
FIG. 36 illustrates a thirteenth step of a fabrication process in which a surface is roughened by oxide spacers around vias, in accordance with an alternative embodiment of the present invention.
Figure 37:
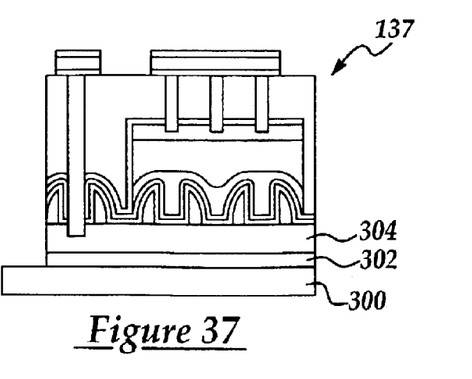
FIG. 37 depicts a fourteenth step of a fabrication process in which a surface is roughened by oxide spacers around vias, in accordance with an alternative embodiment of the present invention.

FIG. 36 illustrates a thirteenth step 136 of a MIM capacitor process in which a surface is roughened by oxide spacers around vias, in accordance with an alternative embodiment of the present invention. FIG. 36 depicts Ti/TiN/W depositions for Via-5 filling, followed by CMP of tungsten for isolation. FIG. 37 depicts a fourteenth step 137 of a fabrication process in which a surface is roughened by oxide spacers around vias, in accordance with an alternative embodiment of the present invention. FIG. 37 illustrates metal-6 layers (TiN/Cu—Al/TiN) depositions, followed by photo patterning and etching for formation of interconnect.

Figure 38:
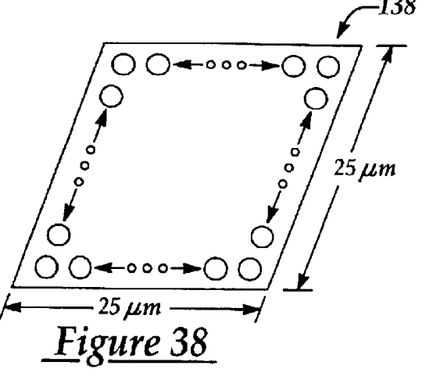
FIG. 38 illustrates a capacitor area configuration, in accordance with a preferred or alternative embodiment of the present invention.

FIG. 38 generally illustrates capacitance increases that may be obtained according to the processing steps described herein, in accordance with preferred or embodiments of the present invention. Configuration 138 of FIG. 38 indicates a increase of electrode area can be obtained from roughened surface (by spacers) on a foot area of 25 Fm×25 Fm. Capacitance density is thus enhanced by this invention (i.e. prior art) as shown in the following estimations.

Two fabrication cases have been described herein. A first case is described in accordance with a preferred embodiment of the present invention, while a second case is described in accordance with an alternative embodiment of the present invention. In the case of the preferred embodiment described herein, for example, if the following holds true:

(1) PE-oxide island=1 um in diameter;

(2) PE-oxide island spacing=1 u;

Then, given an island height of approximately 3 kA, the formed electrode area of MIM capacitor is approximately 896 um$^2$, which amounts to a 43% increase in area (than the non-roughened foot area). Given an island height of approximately 5 kA, the formed MIM capacitor area is approximately 1077 um$^2$, which amounts to a 73% increase in area capacitance. Given an island height of approximately 8 kA, the formed MIM capacitor area is approximately 1349 um$^2$, which amounts to a 116% increase in area capacitance. These calculations can be obtained based on the fact that currently there are not more than 144 oxide islands on current MIM capacitor planes (i.e., 25 um by 25 um).

In the case of the alternative embodiment described herein, for example, if the following holds true:

(3) PE-oxide island=0.5 um in diameter (4) PE-oxide island spacing=0.5 um

Then, given an island height of approximately 3 kA, the formed MIM capacitor area is approximately 1710 um$^2$, which amounts to a 174% increase in area capacitance. Given an island height of approximately 5 kA, the formed MIM capacitor area is approximately 2434 um$^2$, which amounts to a 289% increase in area capacitance. Given an island height of approximately 8 kA, the formed MIM capacitor area is approximately 3520 um$^2$, which amounts to a 463% increase in area capacitance. These calculations can be obtained based on the fact that currently there are not more than 576 oxide islands on current MIM capacitor planes.

The present invention thus discloses a method for fabricating an MIM capacitor on a substrate. A region of the substrate is generally dedicated for use as an electrode area of the MIM capacitor. The electrode area of the MIM capacitor may be increased by utilizing at least one spacer formed on an associated planar metal surface, wherein the planar metal surface is generally formed upon the substrate. An increase in a gain factor of the electrode area is thus dependent upon an associated spacer height and particular islands or vias. A roughened surface is thus created for use as a roughened electrode for subsequent capacitor processes. Fabricating spacers made of conducting or non-conducting materials on the associated planar metal surface can create such an electrode. The MIM capacitor formed thereof can be utilized in mixed-signal and RF applications and is fully compatible with COMS logic fabrication processes.

Thus, two novel fabrications methods for forming low-temperatures MIM capacitors with surface roughening are described herein. The first MIM capacitor formation technique disclosed herein, in accordance with a preferred embodiment of the present invention, involves the formation of PE-oxide islands on a metal surface. The PE-oxide islands (i.e., oxide islands) will be removed later. Spacers of conducting materials (e.g., TiN or Tan) are formed by deposition and etching techniques about the oxide islands. Such a conducting spacer thus provides a short to the metal surface below. Thereafter, the oxide islands are removed. The metal surface with conducting spacers there above thus becomes a roughened electrode for subsequent capacitor processes.

The second MIM capacitor formation technique disclosed herein, in accordance with an alternative embodiment of the present invention, involves the formation of oxide vias with tapered edge on metal. After the vias are filled through spin coating and removal with protection material (e.g., photoresist, organic ARC, etc.), protection material on the oxide surface can be removed by etch back or CMP. The oxide surface is then etched by an anisotropic oxide etching, so that oxide spacers around the vias are formed. Following PR cleaning (i.e., a cleaning step), the oxide spacers on the metal surface is coated with a thin conduction material, such as, form example, TiN or TaN, to form a roughened electrode surface. Subsequent capacitor processes may then follow to complete any remaining fabrication steps. The area gain factor of the resulting electrode thus depends on the spacer height and dimensions of the formed islands or vias.

The present invention thus discloses an innovative semiconductor MIM capacitor fabrication process that is fully compatible with logic processes for mixed-signal and/or RF applications. The present invention also discloses unique fabrication methods in which the effective electrode surface area is significantly enlarged so that the capacitance density (per unit foot area) can be greatly enhanced by a factor of 2 or more. FIG. 38 in particular illustrates the fact that capacitance density can be increased by a factor of 2 or more, which greatly reduces MIM capacitor footprints with the same capacitance value. The effective electrode area increase thus depends on the height of spacers and the density of spacer formations thereof.

Figure 39:
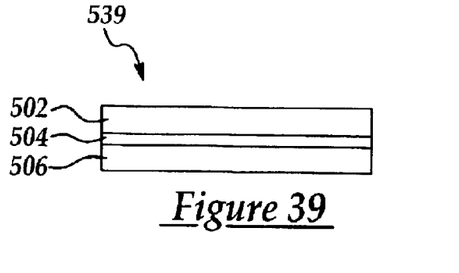
FIG. 39 depicts a first step of a fabrication process in accordance with an alternative embodiment of the present invention.

FIGS. 39–52 illustrate an alternative fabrication process, which can be implemented in accordance with an alternative embodiment of the present invention. In FIGS. 39–52, identical or similar parts are represented by identical reference numerals. FIGS. 39–52 represent a sequential series of fabrication steps. FIG. 39 depicts a first step 539 of a fabrication process in accordance with an alternative embodiment of the present invention. As indicated in FIG. 39, metal deposition for a bottom electrode involves the deposition of layers 504 and 502 above a substrate 506. Layer 504 comprises a layer of TiN (e.g., 250A) and layer 502 comprises a layer of Al—Cu (e.g., 4 kA).

Figure 40:
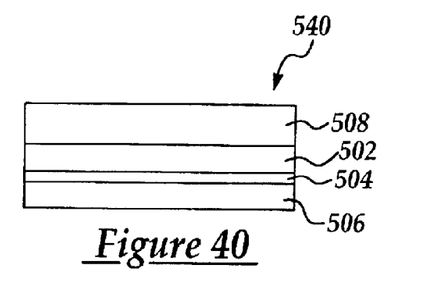
FIG. 40 illustrates a second step of a fabrication process in accordance with an alternative embodiment of the present invention.

FIG. 40 illustrates a second step 540 of a fabrication process in accordance with an alternative embodiment of the present invention. As indicated in FIG. 40, a sacrificial PE-oxide layer of approximately 1 kA to 15 kA can be deposited above layer 502 at a low temperature of approximately 400 degrees Celsius.

Figure 41:
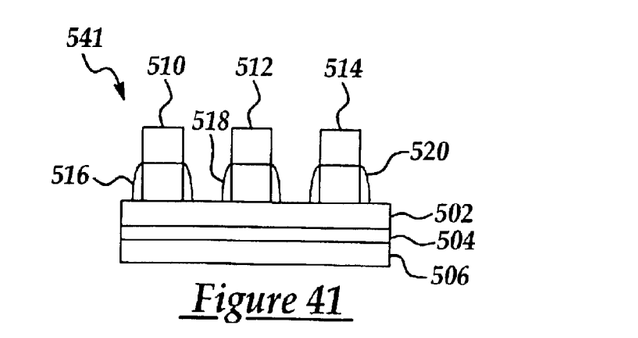
FIG. 41 depicts a third step of a fabrication process in accordance with an alternative embodiment of the present invention.

FIG. 41 depicts a third step 541 of a fabrication process in accordance with an alternative embodiment of the present invention. As indicated in FIG. 41, a PE-oxide photo patterning and etching operation can occur, followed thereafter by photoresist removal. In FIG. 41, photoresists 510, 512, and 514 are respectively indicate above carved out PE-oxide islands 516, 518 and 520, which are formed from layer 508 (i.e., see FIG. 40).

Figure 42:
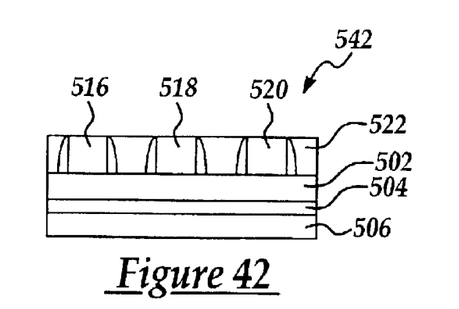
FIG. 42 illustrates a fourth step of a fabrication process in accordance with an alternative embodiment of the present invention.

FIG. 42 illustrates a fourth step 542 of a fabrication process in accordance with an alternative embodiment of the present invention. In FIG. 42, PR spin coating and removal by partial photo-exposure and development can be processed. Alternatively, an etch back or CMP operation may be implemented until the PE-oxide surface is exposed. FIG. 42 depicts a photoresist layer 522.

Figure 43:
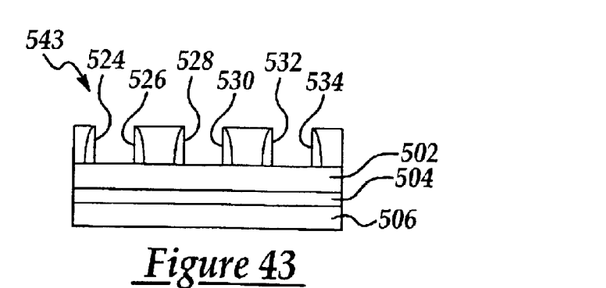
FIG. 43 depicts a fifth step of a fabrication process in accordance with an alternative embodiment of the present invention.

FIG. 43 depicts a fifth step 543 of a fabrication process in accordance with an alternative embodiment of the present invention. FIG. 43 illustrates a fabrication step in which an-isotropic RIE etching is performed to form oxide spacers (i.e., oxide spacer rings) 524, 526, 528, 530, 532 and 534. A photoresist removal step can follow.

Figure 44:
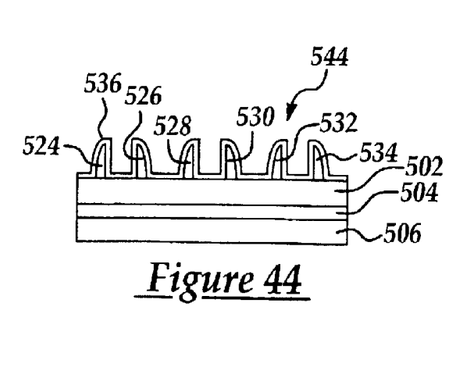
FIG. 44 illustrates a sixth step of a fabrication process in accordance with an alternative embodiment of the present invention.

FIG. 44 illustrates a sixth step 544 of a fabrication process in accordance with an alternative embodiment of the present invention. As indicated in FIG. 44, a thin TiN layer 536 (e.g., 250A) of film is deposited above oxide spacers 524, 526, 528, 530, 532, and 534. Note that such oxide spacers form rings. For example, oxide spacers 524 and 526 form a ring, while oxide spacers 528 and 530 also form a ring. Similarly, oxide spacers 532 and 534 form a ring. Thus, according to FIG. 44, a thin TiN layer is deposited on the oxide spacers and Al—Cu surfaces (i.e., layer 502).

Figure 45:
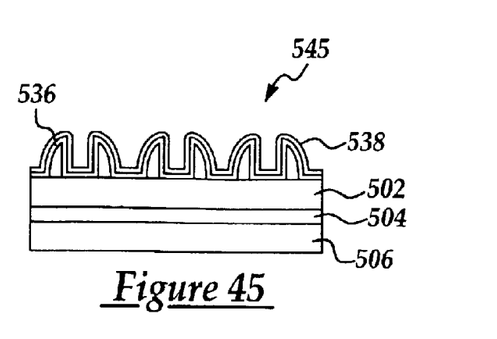
FIG. 45 depicts a seventh step of a fabrication process in accordance with an alternative embodiment of the present invention.

FIG. 45 depicts a seventh step 545 of a fabrication process in accordance with an alternative embodiment of the present invention. FIG. 45 illustrates an fabrication step in which a dielectric layer 538 of film (e.g., approximately 400 A) is deposited at approximately 400 degrees Celsius. Note that layer 538 comprises a layer of PE-oxide.

Figure 46:
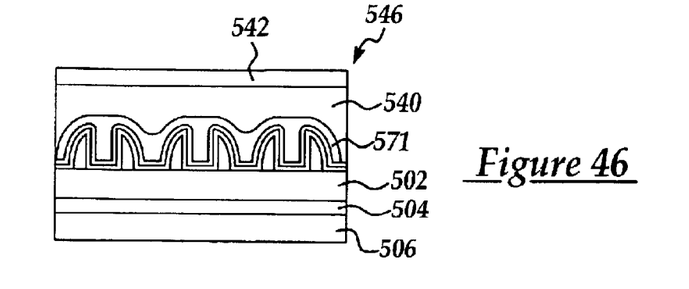
FIG. 46 illustrates an eighth step of a fabrication process in accordance with an alternative embodiment of the present invention.

FIG. 46 illustrates an eighth step 546 of a fabrication process in accordance with an alternative embodiment of the present invention. As indicated in FIG. 46, a capacitor top metal (CTM) is deposited, which includes TiN (e.g., 250A), Al—Cu (1200 A), and TiN (e.g., 700 A) layers. Note that a layer 542 of TiN (e.g., 750 A) is illustrated above a layer 540 of Al—Cu (e.g. 1.2 kA) and a layer 571 of TiN. Layer 571 is located above layer 538 (i.e., PE-oxide layer).

Figure 47:
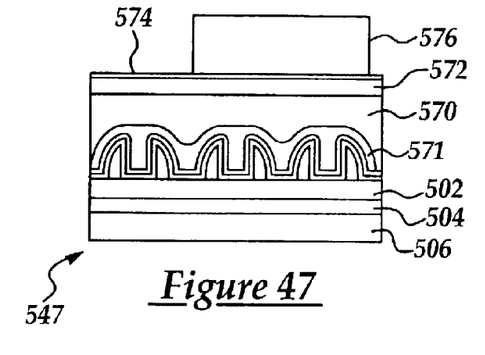
FIG. 47 depicts a ninth step of a fabrication process in accordance with an alternative embodiment of the present invention.

FIG. 47 depicts a ninth step 547 of a fabrication process in accordance with an alternative embodiment of the present invention. FIG. 57 illustrates deposition of an SiON BARC layer 574 (e.g., approximately 320 A) and a capacitor top metal (CTM) photo patterning indicated by layer 576. Note that layer 576 is a photoresist layer.

Figure 48:
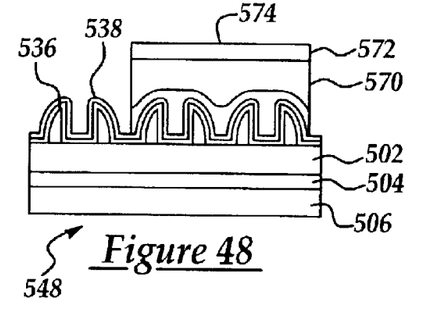
FIG. 48 illustrates a tenth step of a fabrication process in accordance with an alternative embodiment of the present invention.

FIG. 48 illustrates a tenth step 548 of a fabrication process in accordance with an alternative embodiment of the present invention. As indicated in FIG. 48, a capacitor top metal (CTM) etching operation can be implemented followed by a PE-oxide deposition step (i.e., CTM surface area is approximately 25 um×25 um).

Figure 49:
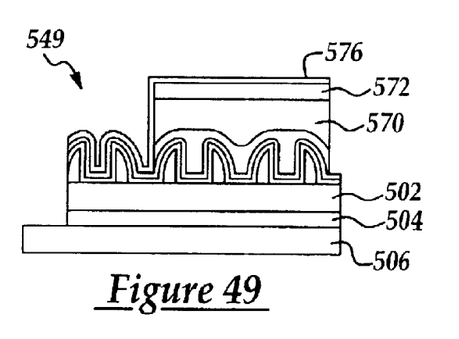
FIG. 49 depicts an eleventh step of a fabrication process in accordance with an alternative embodiment of the present invention.

FIG. 49 depicts an eleventh step 549 of a fabrication process in accordance with an alternative embodiment of the present invention. As illustrated in FIG. 49, an SiON BARC deposition layer 576 of approximately 320 A may be deposited followed by a Metal-5 photo patterning/etching operation. Note that the SiON layer 576 may also be approximately 300 A, depending on a desired implementation.

Figure 50:
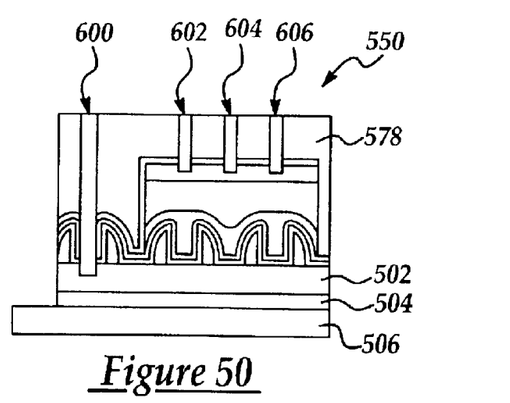
FIG. 50 illustrates a twelfth step of a fabrication process in accordance with an alternative embodiment of the present invention.

FIG. 50 illustrates a twelfth step 550 of a fabrication process in accordance with an alternative embodiment of the present invention. FIG. 50 depicts FSG deposition (e.g., 10 kA-20 kA) and CMP planarization for inter-metal-dielectric (IMD-5) followed by Via-5 photo patterning and etching. Layer 578 thus comprises an FSG layer. Vias (i.e., Via-5) 600, 602, 604 and 606 also illustrated in FIG. 5 within FSG layer 578.

Figure 51:
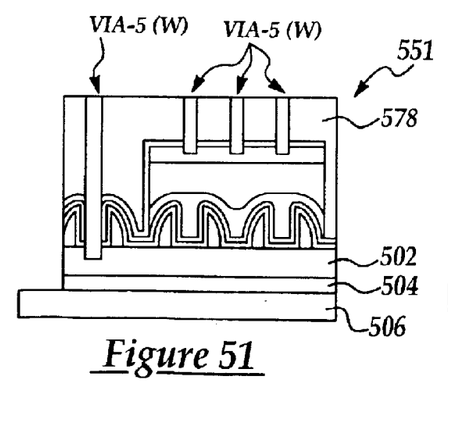
FIG. 51 depicts a thirteenth step of a fabrication process in accordance with an alternative embodiment of the present invention.
Figure 52:
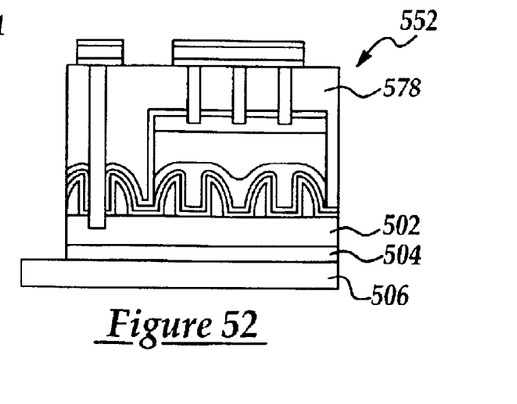
FIG. 52 illustrates a sixteenth step of a fabrication process in accordance with an alternative embodiment of the present invention.

FIG. 51 depicts a thirteenth step 551 of a fabrication process in accordance with an alternative embodiment of the present invention. FIG. 51 depicts Ti/TiN/W depositions for Via-5 filling, followed by CMP isolation. Note that via-5 is filled with W (i.e., Tungsten). FIG. 52 illustrates a sixteenth step 552 of a fabrication process in accordance with an alternative embodiment of the present invention. FIG. 52 indicates metal-6 (i.e., TiN/Cu—Al/TiN) depositions followed photo patterning and etching.

The embodiments and examples set forth herein are presented to best explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered. The description as set forth is thus not intended to be exhaustive or to limit the scope of the invention. Many modifications and variations are possible in light of the above teaching without departing from scope of the following claims. It is contemplated that the use of the present invention can involve components having different characteristics. It is intended that the scope of the present invention be defined by the claims appended hereto, giving full cognizance to equivalents in all respects.

What is claimed is:

1. An MIM capacitor formed on a substrate, said MIM capacitor comprising:
    a region of said substrate dedicated for use as an electrode area of said MIM capacitor; and
    at least one spacer for increasing said electrode area of said MIM capacitor, wherein said at least one spacer is formed on an associated planar metal surface, wherein associated said planar metal surface is formed upon an entire surface of said substrate, such that an increase in a gain factor of said electrode area is dependent upon an associated spacer height and particular islands or vias thereof.

2. The MIM capacitor of claim 1 wherein said at least one spacer comprises a conducting material formed upon said substrate.

3. The MIM capacitor of claim 2 wherein said conducting material comprises TiN.

4. The MIM capacitor of claim 2 wherein said conducting material comprises TaN.

5. The MIM capacitor of claim 2 wherein said at least one spacer provides a short to said metal surface formed below said at least one spacer.

6. A MIM capacitor for fabricating an MIM capacitor on a substrate, said MIM capacitor comprising:
    a region of said substrate dedicated for use as an electrode area of said MIM capacitor;
    at least one oxide island formed upon a metal surface formed upon an entire surface of said substrate, wherein at least one spacer formed about said at least one oxide island comprises a conducting material; said at least one spacer adapted for use as a short to said metal surface formed below said at least one spacer;
    wherein said at least one oxide island is removed, such that said metal surface with said at least one spacer formed there above comprises a roughened electrode for use in said MIM capacitor formed upon said substrate;
    wherein said MIM capacitor formed upon said substrate, wherein said MIM capacitor comprises a low-temperature MIM capacitor; and
    wherein said at least one spacer utilized to increase said electrode area of said MIM capacitor, such that an increase in a gain factor of said electrode area is dependent upon an associated spacer height and particular oxide islands or vias thereof.

7. The MIM capacitor of claim 6 further comprising:
    a metal layer formed upon said substrate;
    at least one oxide via formed upon said metal layer.

8. The MIM capacitor of claim 7 further comprising:
    a protection material that fills said at least one oxide via.

9. The MIM capacitor of claim 8 wherein said protection material comprises a photoresist.

10. The MIM capacitor of claim 8 wherein said protection material comprises an organic material.

11. The MIM capacitor of claim 8 wherein said at least one oxide via is filled with a protection material by spin coating and removal thereof until at least one oxide surface is exposed.

12. The MIM capacitor of claim 11 wherein at least one oxide spacer is formed around said at least one oxide via by performing an anisotropic oxide etch.

13. The MIM capacitor of claim 12 wherein said substrate and structures formed thereupon are cleaned and wherein said at least one oxide spacer is coated with a thin conducting material to form a roughened electrode surface thereof.

14. The MIM capacitor of claim 13 wherein said MIM capacitor is formed upon said substrate, such that said MIM capacitor includes said roughened electrode surface for use as said electrode area and wherein said at least one oxide spacer increases said electrode area of said MIM capacitor.

15. A MIM capacitor for fabricating an MIM capacitor on a substrate, said method comprising the steps of:
    a bottom metal electrode formed on said substrate;
    a sacrificial layer formed upon said bottom metal electrode;
    said sacrificial layer patterned into an island structure to form an island sacrificial structure;
    a first diffusion layer formed on said island sacrificial structure;
    at least one spacer formed by said first diffusion layer, wherein said island sacrificial structure is removed thereafter;
    a second diffusion layer formed on said at least one spacer;
    a dielectric layer formed thereon; and
    a top metal electrode thereon.

16. The MIM capacitor of claim 15 wherein said bottom metal electrode is Al—Cu.

17. The MIM capacitor of claim 15 wherein an adhesion layer is formed between said bottom metal electrode and said substrate.

18. The MIM capacitor of claim 17 wherein said adhesion layer comprises TiN.

19. The MIM capacitor of claim 15 wherein said sacrificial layer comprises oxide and wherein said first diffusion layer comprises TiN.

20. The MIM capacitor of claim 15 wherein said first diffusion layer comprises TiN.

21. The MIM capacitor of claim 15 wherein said at least one spacer is formed as a result of an etch back step.

22. The MIM capacitor of claim 15 wherein said second diffusion layer comprises TiN.

23. The MIM capacitor of claim 15 wherein said top metal electrode comprises Al—Cu.

24. The MIM capacitor of claim 23 wherein a third diffusion layer is formed on said top metal electrode.

25. The MIM capacitor of claim 24 wherein said third diffusion layer comprises TiN.

26. The MIM capacitor of claim 25 further comprising:

a photoresist formed above said third diffusion layer;

an SiON BARC deposition layer;

an FSG layer deposited thereon;

Ti, TiN and W filled within one or more Via-5 structures; and a metal-6 layer formed thereon based on a TiN/Cu—Al/Tin deposition operation.

27. An MIM capacitor formed on a substrate, said MIM capacitor comprising:

a region of said substrate dedicated for use as an electrode area of said MIM capacitor;

at least one spacer for increasing said electrode area of said MIM capacitor, wherein said at least one spacer is formed on an associated planar metal surface, wherein associated said planar metal surface is formed upon an entire surface of said substrate, such that an increase in a gain factor of said electrode area is dependent upon an associated spacer height and particular islands or vias thereof and wherein said MIM capacitor comprises a low-temperature MIM capacitor and wherein said at least one spacer comprises a TaN conducting material formed upon said substrate, such that said at least one spacer provides a short to said metal surface formed below said at least one spacer; and at least one sacrificial island formed upon said associated planar metal surface on said substrate, wherein said at least one sacrificial island comprises an oxide island and wherein said at least one sacrificial island is removable, such that said metal surface with said at least one spacer formed thereabove comprises a roughened electrode for use with said MIM capacitor upon said substrate.

* * * * *